(12) United States Patent
Chang (10) Patent No.: US 9,459,314 B1
(45) Date of Patent: Oct. 4, 2016

(54) CIRCUIT AND METHOD FOR REAL-TIME MONITORING OF PROCESS, TEMPERATURE, AND VOLTAGE VARIATIONS

(71) Applicant: PMC-SIERRA US, INC., Sunnyvale, CA (US)

(72) Inventor: Howard Shih Hao Chang, Vancouver (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 66 days.

(21) Appl. No.: 14/510,005

(22) Filed: Oct. 8, 2014

(51) Int. Cl.
*H03B 19/00* (2006.01)
*G01R 27/26* (2006.01)
*G01R 31/28* (2006.01)
*H03K 5/14* (2014.01)

(52) U.S. Cl.
CPC ............ *G01R 31/2882* (2013.01); *H03K 5/14* (2013.01)

(58) Field of Classification Search
CPC .................................. G01R 31/2882; H03K 5/14
See application file for complete search history.

(56) References Cited

U.S. PATENT DOCUMENTS 7,298,178 B1 * 11/2007 Sun .................. H03K 19/17732
    327/10
8,060,766 B2 * 11/2011 Konstadinidis ........... G06F 1/08
    327/101
2013/0300463 A1    11/2013 Gemmeke et al.

* cited by examiner

*Primary Examiner* — Jermele M Hollington
*Assistant Examiner* — Farhana Hoque
(74) *Attorney, Agent, or Firm* — Letters Patent, LLC; Dennis R. Haszko (57) ABSTRACT

The present disclosure provides a monitoring system for monitoring the operation of an integrated circuit, the monitoring system comprising: a reference circuit comprising a reference signal delay path and an output for outputting a reference signal; a monitoring circuit, the monitoring circuit comprising: a programmable delay line for providing a controllably selectable delay path; and an output for outputting a delayed signal; a comparison circuit, for comparing the reference signal to the delayed signal and determining whether the error has occurred based on the comparison.

12 Claims, 7 Drawing Sheets

CIRCUIT AND METHOD FOR REAL-TIME MONITORING OF PROCESS, TEMPERATURE, AND VOLTAGE VARIATIONS

FIELD

The present disclosure relates generally to the monitoring of the operation of digital circuits. More particularly, the present disclosure relates to circuits and method for the monitoring of temperature and voltage changes and for general measurement of global or local process variations.

BACKGROUND

In deep submicron integrated circuits, process variation can be very significant. The same circuit can be "fast" in one wafer and "slow" in another. Even within the same wafer, it can be fast in one die but slower in the other. The speed of the circuit is also dependent on the supply voltage level as well as temperature but to a lesser extent. In general, circuits speed up when supply voltage is raised and slow down when supply voltage is lowered.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides a monitoring system for monitoring the operation of an integrated circuit, the monitoring system comprising: a reference circuit comprising a reference signal delay path and an output for outputting a reference signal; a monitoring circuit, the monitoring circuit comprising: a programmable delay line for providing a controllably selectable delay path; and an output for outputting a delayed signal; a comparison circuit, for comparing the reference signal to the delayed signal and determining whether the error has occurred based on the comparison.

In some embodiments, the reference circuit comprises a register and an inverter coupled in a feedback loop.

In some embodiments, the inverted output of the register is used along with a buffer instead of the non-inverted input and an inverter.

In various embodiments, the monitoring circuit further comprises: a register; and an inverter; wherein the register, the delay line, and the inverter are coupled in a feedback loop.

In some embodiments, the inverted output of the register is used along with a buffer instead of the non-inverted input and an inverter.

In some embodiments, the programmable delay line comprises a plurality of buffers and multiplexers coupled to each other such that a number of buffers in the delay line is controllably selectable.

In various embodiments, monitoring system further includes an auto calibrator circuit coupled to the programmable delay line for calibrating the delay line.

In some embodiments, the monitoring system is configured to: set a delay length of the delay line; compare the delay signal to the reference signal; if a value of the delay signal does not match a value of the reference signal, then: incrementally increase the delay length; and for each value of the delay length, compare the delay signal to the reference signal; record the delay length when either value of the delay signal does not match a value of the reference signal or a maximum value of the delay length is reached.

In some embodiments, the monitoring system is configured to: set a delay length of the delay line; compare the delay signal to the reference signal; if a value of the delay signal does not match a value of the reference signal, then: incrementally decrease the delay length; and for each value of the delay length, compare the delay signal to the reference signal; record the delay length when either value of the delay signal does not match a value of the reference signal or a minimum value of the delay length is reached.

In a further aspect, there is provided a method of monitoring the operation of circuit of an integrated circuit, the method comprising: providing a reference circuit on the integrated circuit, the reference circuit comprising a reference signal delay path and an output for outputting a reference signal; providing a monitoring circuit on the integrated circuit, the monitoring circuit comprising: a programmable delay line for providing a controllably selectable delay path; and an output for outputting a delayed signal; setting a delay length of the programmable delay line; providing power to the integrated circuit; and comparing the reference signal and the delay signal.

In some embodiments, providing power to the integrated circuit comprises powering up a power gated region of the integrated circuit.

In some embodiments, the method further comprises determining that an error has occurred if a value of the delay signal does not match a value of the reference signal.

In some embodiments, the method further comprises if an error has not occurred, incrementally adjusting the delay length of the programmable delay line; and periodically comparing the reference signal and delay signal.

In some embodiments, the method further comprises if an error has occurred, estimating a voltage drop experienced by a power gated region based on the delay length of the programmable delay line.

In some embodiments, the initial value of the delay line length is a maximum delay line length of the programmable delay line and the delay length is incrementally reduced.

In some embodiments, the initial value of the delay line length is a minimum delay line length of the programmable delay line and the delay length is incrementally increased.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Various embodiments disclosed herein are applicable to very large scale integrated (VLSI) digital circuits where the designs may be sensitive to one or more of process, voltage, and temperature. Some embodiments of the present disclosure can be used to detect real-time temperature and voltage changes and for general measurement of global (die to die) or local (on-chip) process variations.

This disclosure describes a method and apparatus to detect dynamic voltage drop induced by in-rush current when a nearby power gated region is turned on. Some embodiments of the apparatus include a simple canary circuit containing a programmable delay line and comparison logic. In various embodiments, the circuit can be run continuously and if the delay line slows down sufficiently due to a significant voltage drop, the canary circuit fails and an alarm is triggered by the comparison logic.

"Setup time" refers to the required arrival time of a data signal prior to arrival of the clock at a flip-flop. Meeting the setup time ensures that data will be latched correctly in the flip-flop. If the data signal fails to stabilize and misses setup time, the wrong data will get latched. Synchronous devices are generally designed to meet certain frequency requirements under specific process, voltage and temperature (PVT) conditions. If the voltage level drops below the design specification, a circuit may become so slow that it fails setup time, causing data corruption.

Power gating is a widely used technique to reduce leakage power. When a certain part of the device is in idle, the supply power can be cut-off, eliminating leakage power loss. Typically this is done by inserting in-line power FETs (sometimes called header cells or footer cells) on the VDD or VSS supply of a particular region of the device. When power to a region is cut off, the electrical charges in the wires and the gates drain away due to leakage. When the power FETs are turned on to restore power, electrical current starts to flow immediately to charge up the wires and gates, until it is restored to either logic-1 or logic-0 levels, at which point current settles down to the normal leakage range. The sudden current draw at turn-on and for a transient period thereafter is called "in-rush" current. When power FETs are turned on too quickly, in-rush current can be quite substantial. The main power supply to the device may not be capable of reacting to the large change in current (di/dt) due to inductance on the power network. In such a case, current may be sourced from nearby operating logic on-die which would cause a local voltage drop and may cause circuits in this vicinity to fail.

Dynamic voltage drop in a digital circuit can potentially cause chip failures due to the reduction of circuit performance below design specifications. For example, such a voltage drop can be induced by power-on or power-off events of a power gated region. Quantifying the magnitude of induced IR drop during power-on events can be part of a solution for ensuring design robustness. Since direct measure of dynamic voltage levels are not feasible due to their transient nature and the difficulty of monitoring on-die current directly, in various embodiments disclosed herein a special monitoring circuit is implemented to indirectly measure the effect of induced voltage drop by monitoring the speed of the circuit in real time.

Various embodiments disclosed herein relate to a real-time PVT (Process Voltage Temperature) monitor using canary circuits. In some embodiments, each canary circuit has an internal programmable delay line that can be controlled to add delays to its monitored timing path. A basic principle of operation of some embodiments is that the canary circuit is first programmed to have a small setup margin according to either SPICE or STA (Static Timing Analysis) under a given process corner. Process corners refer to variations of fabrication parameters, which are parameters that are used in producing a semiconductor wafer based on an integrated circuit design, under which an integrated circuit is expected to function properly. If voltage or temperature fluctuations cause the circuit to slow down beyond the design specification, setup time will be violated and a detection circuit will trigger an alarm. In various embodiments, the circuit also contains an internal calibrator that automatically calculates how many delay taps can be active in a clock cycle under current process, voltage and temperature conditions without causing a failure for performance analysis.

Figure 1:
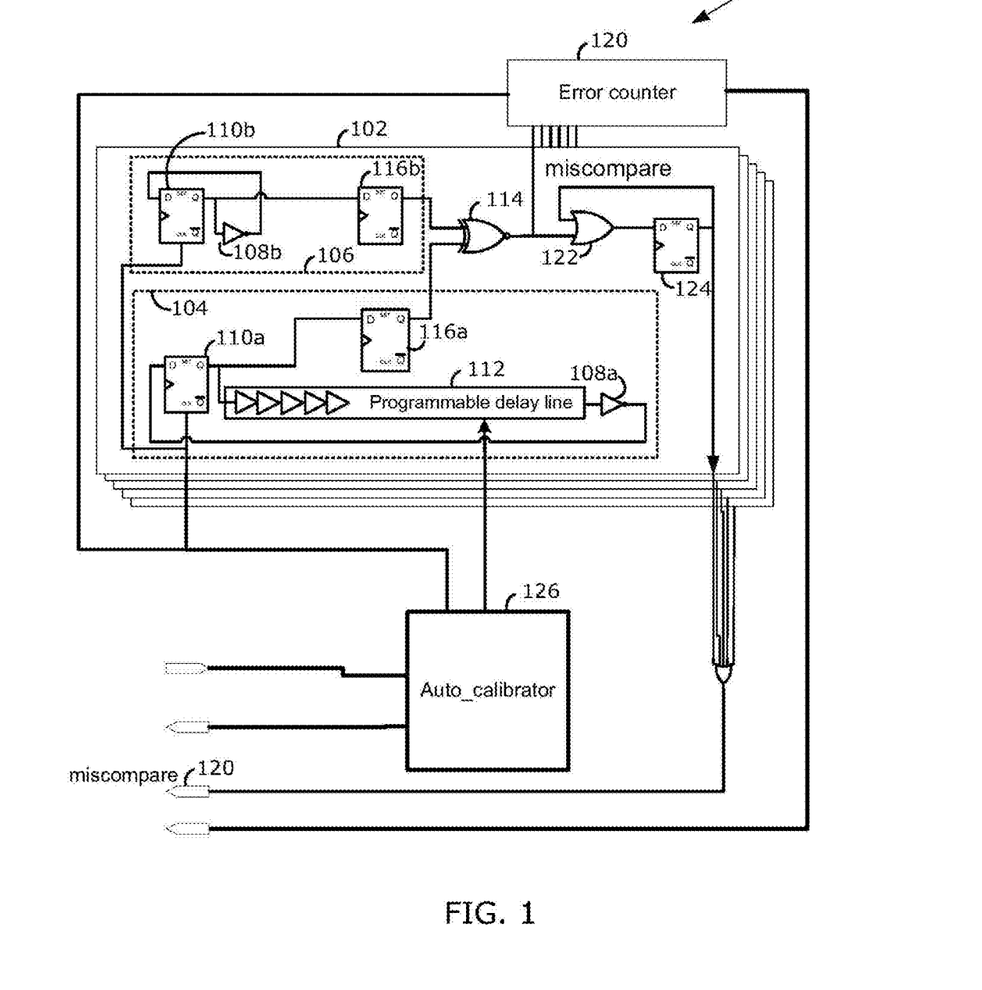
FIG. 1 is a block diagram of a circuit, in accordance with an embodiment of the present disclosure.

There are various possible applications of the embodiments disclosed herein. Some of these applications include but are not limited to:
  Detecting a dynamic voltage drop induced by in-rush current during power-up or power-down transition of a power gated region.
  Measuring process speed in real time
  Measuring the long term aging effect with multiple samples over long periods or after induced aging via burn-in or other techniques FIG. 1 is a simplified block diagram of a canary system 100 in accordance with the present disclosure. The canary system 100, which will also be referred to as a monitoring system 100, includes a monitoring circuit 102. As shown in FIG. 1, system 100 can include a plurality of monitoring circuits 102. In some embodiments, multiple variations of monitoring circuits 102 are instantiated to monitor different types of logic cells because the variations of each type do not necessarily track the other types. Examples of different types of logic cells include, but are not limited to, low-vt cells, high-vt cell, standard-vt cells, long and short channel cells.

Monitoring circuit 102 comprises a canary circuit 104 and a reference circuit 106. In various embodiments, the canary circuit 104 comprises an inverter 108a feeding back to a register 110a with programmable delay line 112 added to adjust the setup margin. In some embodiments, the reference circuit 106 can be identical in structure but without the additional delay. Accordingly, in some embodiments reference circuit 106 comprises a register 110b and an inverter 108b. When the circuit slows down, due to transient voltage drop for example, the canary circuit 104 fails setup time and the wrong value will be latched by the register 110a. This causes a mis-comparison with the reference circuit at the exclusive nor (XNOR) gate. Canary circuit 104 and reference circuit 106 each include a register (116a and 116b) between the registers 110a, 110b and XNOR gate 114. In various embodiments, registers 116a and 116b are used to resolve meta-stability. If the D-input of a register transition is too close to the clock transition edge, meta-stability can occur, causing output Q to become unstable (middle point between VDD and VSS or usually referred to as 'X'). These extra registers allow extra time for meta-stability to resolve (to either VDD or VSS) so that the comparison logic does not compare 'X'. Each of these extra registers may be referred to as a synchronizer.

In some embodiments, all canary circuits 104 can be identical in structure except for their cell VT (threshold voltage) and channel length differences. The number of delay taps can be directly programmed or can be automatically calibrated to the maximum delay under the current PVT condition. In various embodiments, system 100 also includes an auto calibrator circuit 126 for calibrating and controlling the programmable delay line 112.

In some embodiments, an internal 8-bit counter 120 keeps track of the number of clock cycles where one or more miscompares have been detected. The 8-bit counter 120 is coupled to the output of XOR gate 114. In some embodiments, the canary circuit 104 is effectively just an inverter and therefore the Q output of register 110a changes every clock cycle. The Q output of register 110b behaves the same way. Both registers 110a and 110b are reset at the same time so as start them off at the same value. When the canary circuit 104 fails setup time for one clock cycle or more, it is out of sync with the reference circuit 106 and the miscompare signal becomes a logic '1'. In various embodiments, for subsequent cycles, miscompare will continue to output '1' even though the setup time is met. This is referred to as a sticky bit since it does not reset without an external reset. In some embodiments, the sticky bit can be implemented by an OR gate 122 coupled to a register 124. The output of the register 124 is the miscompare value. Where a plurality of monitoring circuits 102 are utilized, the miscompare values can be combined with an OR gate 126 to provide an overall miscompare output. The sticky bit is utilized to preserve the indication that a miscompare has occurred. Specifically, in the embodiment described above, if the circuit fails setup time again, it will be in sync with the reference and the miscompare will toggle to '0', even though a miscompare has occurred. Therefore, a miscompare output of '1' indicates that at least one miscompare has occurred. The error counter 120 simply counts the number of times a miscompare signal changes value.

Figure 2:
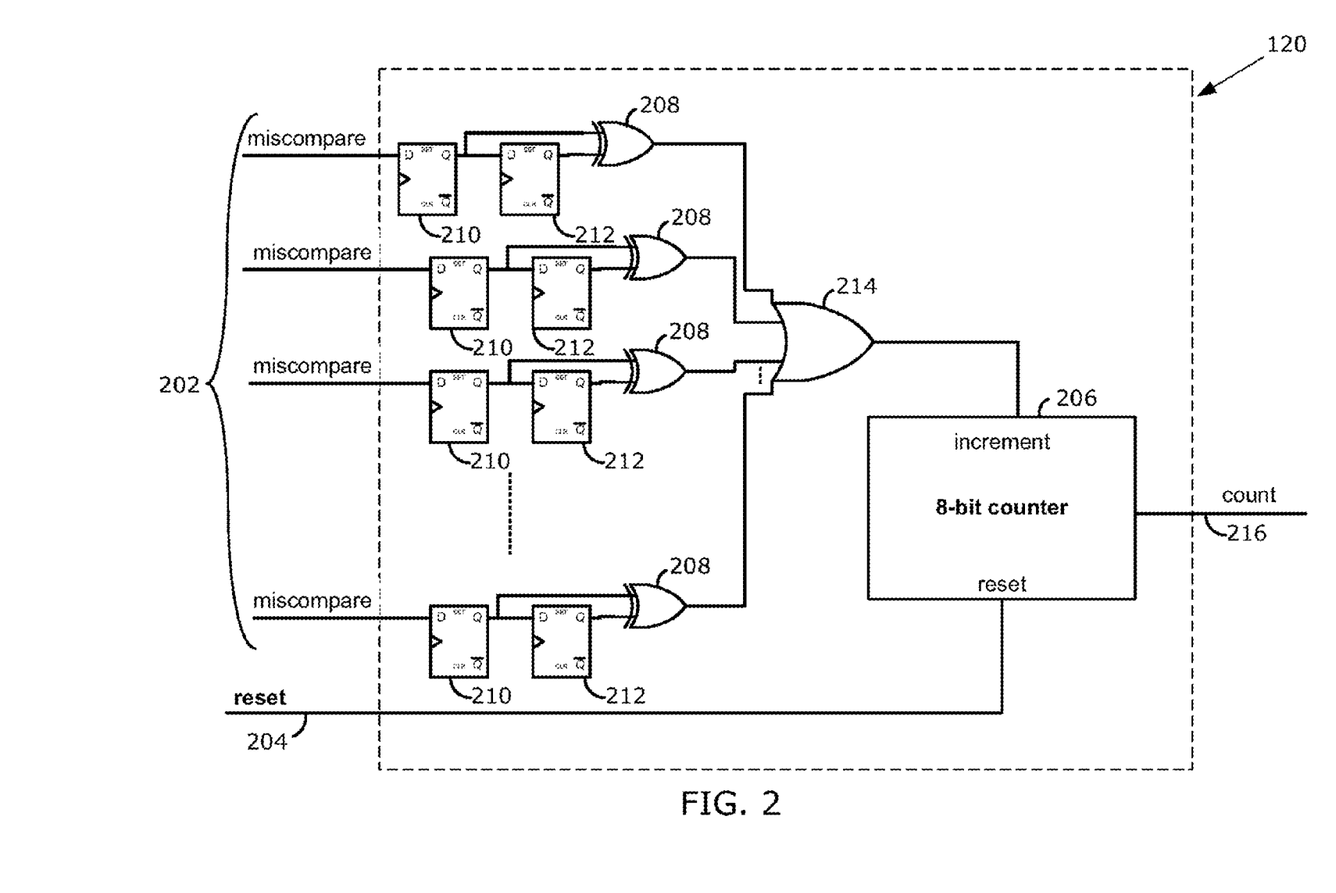
FIG. 2 is a block diagram of an error counter, in accordance with an embodiment of the present disclosure.

FIG. 2 illustrates error counter 120, according to an embodiment. In an embodiment, error counter 120 comprises a plurality of inputs 202 for various monitoring circuits 102 as well as a reset input 204. In the embodiment illustrated, an 8-bit counter 206 is utilized. As mentioned above, error counter 120 counts the number of times that the miscompare output changes value. Accordingly, in various embodiments, the current and previous values of each miscompare signal are combined in an XOR gate 208 prior to being inputted to the counter 206 in order to ensure that only a change in value is counted. Registers 210 and 212 are used to provide the previous and current miscompare values to XOR gate 208. The changes in miscompare values are then combined in an OR gate 214. Error counter 120 also includes an output 216.

Figure 3:
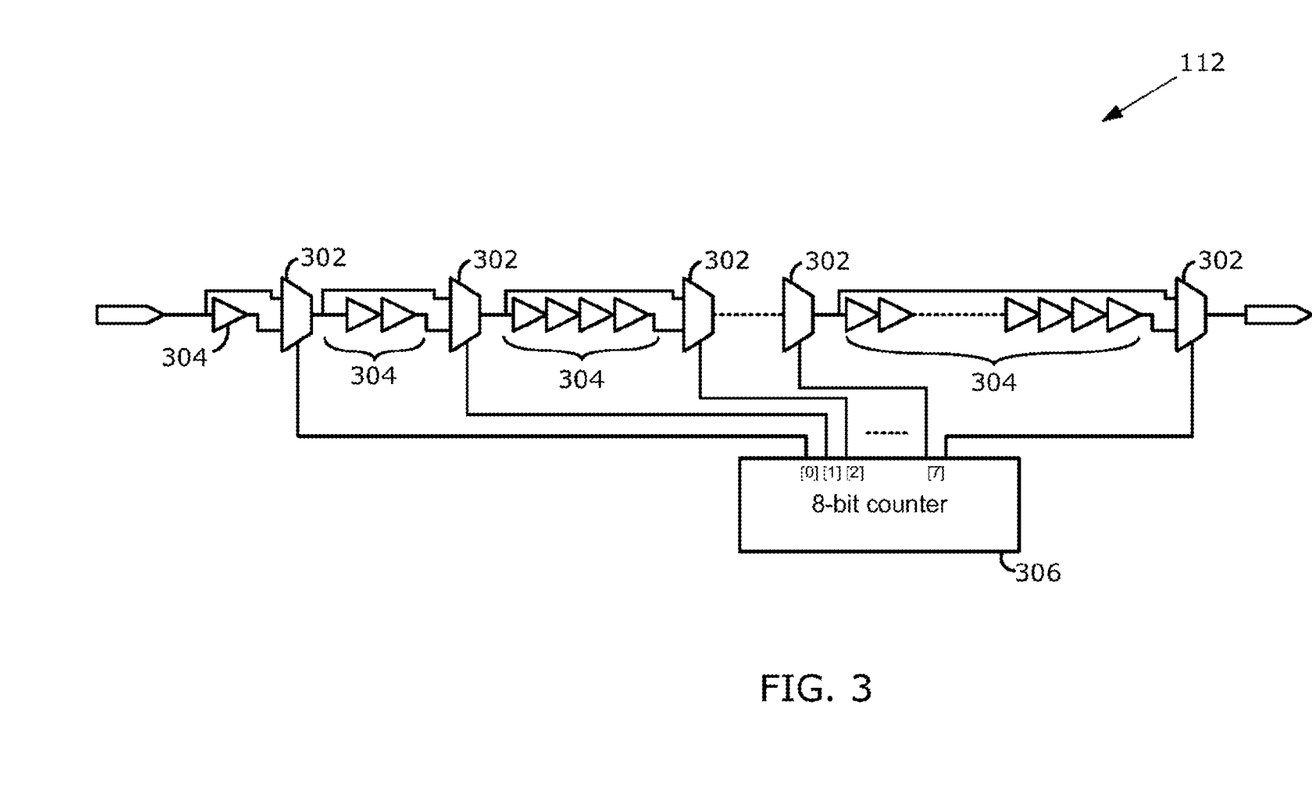
FIG. 3 is a block diagram of a delay line, in accordance with an embodiment of the present disclosure.

FIG. 3 illustrates a delay line 112, according to an embodiment. In some embodiments, the delay line in each canary circuit 104 is composed of eight multiplexers 302 and 255 buffers 304. In such embodiments, the number of buffers 304 utilized on path is selected from zero to 255. In the embodiment illustrated, there is a single buffer 304 before the first multiplexer 302, 2 buffers 304 between the first and second multiplexers 302, 4 buffers 304 between the second and third multiplexers 302, and so on. Other embodiments can use different arrangements. Therefore, the minimum delay is eight multiplexers and the maximum delay is eight multiplexers plus 255 buffers. Other embodiments can utilize a different numbers of multiplexers and a different size of counter. In some embodiments, the multiplexers 302 are coupled to an 8-bit counter 306, which can be used to control the multiplexers 302 such that a specific number of buffers 304 are controllably selected. In various embodiments, the multiplexers 302 are controlled to select buffers 304 so as to cause the delay to be incrementally adjusted.

Figure 4:
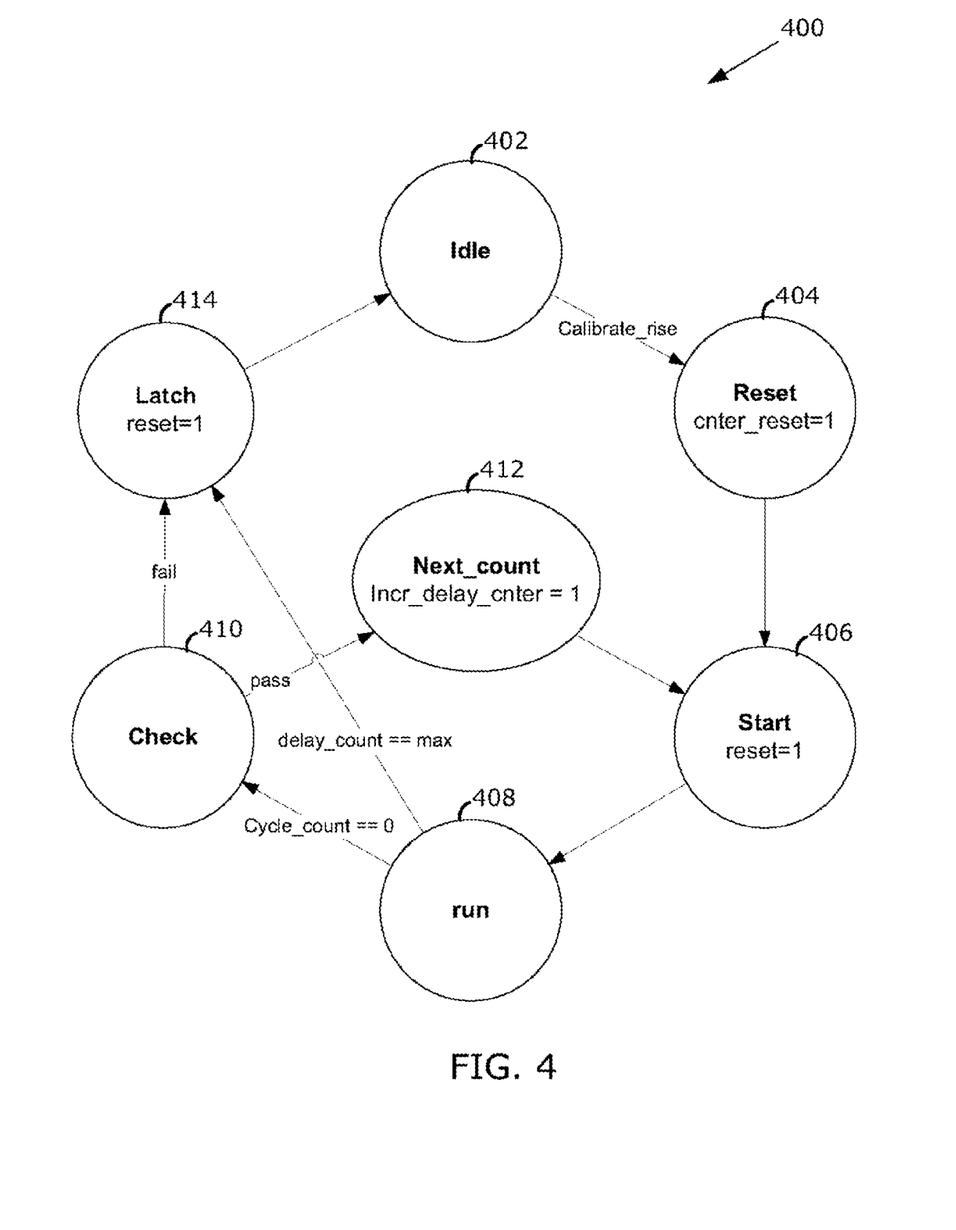
FIG. 4 is a diagram of a finite state machine, in accordance with an embodiment of the present disclosure.

In some embodiments, automatic calibration is performed using the state machine shown in FIG. 4. An alternative representation of a calibration process utilized by some embodiments will be discussed below in relation to FIG. 5.

At 402, circuit 102 is idle. In response to an appropriate command, such as a calibrate signal changing value, the counter 306 is reset at 404. As mentioned above, in some embodiments, an 8-bit counter 306 controls the delay line in binary-code fashion, stepping up one at a time from zero to 255, thus changing delay line 112 from zero buffers upwards to 255 buffers.

At 406, the flip-flops in the reference and canary circuits are reset to the same value. In general, it does not matter whether the reset value is 0 or 1 as long as the same value is used for all of the flip-flops. In addition, the counter used to count the number of cycles to run is also reset.

The circuit 102 is then run at 408. In some embodiments, the canary circuit 104 is enabled for 32 clock cycles at 408. If the counter has reached its maximum (255) value then state 414 is reached and the cycle ends. Otherwise, state 410 is reached. These are examples only and other numbers of clock cycles and maximum counter values can be used in various embodiments.

At 410, it is determined whether or not a miscompare has occurred. If no miscompare is detected, then the counter is incremented at 412 and the cycle repeats starting at 406. If miscompare is detected or the counter has reached its maximum (255) value then the cycle ends.

At the end of the calibration cycle at 414 ("Latch" state), the value of counter 306 is saved to another set of registers, which can be read by the user.

Automatic calibration can be used to determine how to setup the canary circuit to the edge of failure. For example, it can be used to determine the maximum number of buffers that should be used in the delay line. The sensitivity of the canary circuit can be adjusted once this point of failure is known by adjusting the number of buffers on the delay line and the shorter the delay line (fewer number of buffers), the less sensitive the circuit becomes. The IR drop of the power supply can then be inferred by the sensitivity of the canary circuit. The number of buffers can also be derived from static timing analysis (STA) or SPICE simulation under specific PVT corners. By comparing the number from auto calibration with numbers from STA or SPICE, one can approximate the process corner, given that temperate can be measured using other means and voltage can be either directly controlled or measured otherwise.

Some embodiments include two main modes of operation:

In the first mode of operation, the delay count for each delay line can be set explicitly by writing to predefined sets of registers.

In the second mode of operation, the delay count for each delay line can be set automatically by the auto-calibrator. Upon completion of calibration, the value of delay count can be read by the user.

In various embodiments, auto-calibration can be used to determine the failure point of the canary circuit and this can be useful for the characterization of the inrush current. However, when the canary circuit is used to monitor the general dynamic voltage drop during normal operation of the device, the exact failure point may not be as critical. One can set up the delay line according to STA under worst PVT corner (slowest corner, for example SS process). When the silicon happens to be SS corner (same as STA), there will be very little setup margin on the canary circuit. If voltage drop is greater than that STA condition accounts for, the canary circuit will fail. However, if silicon is, say TT or FF corner, gates are faster so a larger voltage drop (to some extent) will not cause chip failure therefore it is not necessary to trigger an alarm. The delay line (hence the canary circuit) behaves similarly. Accordingly, in some embodiments it may be desirable to set the delay line according to the settings in slowest corner as this can be used to avoid false alarms.

Figure 5:
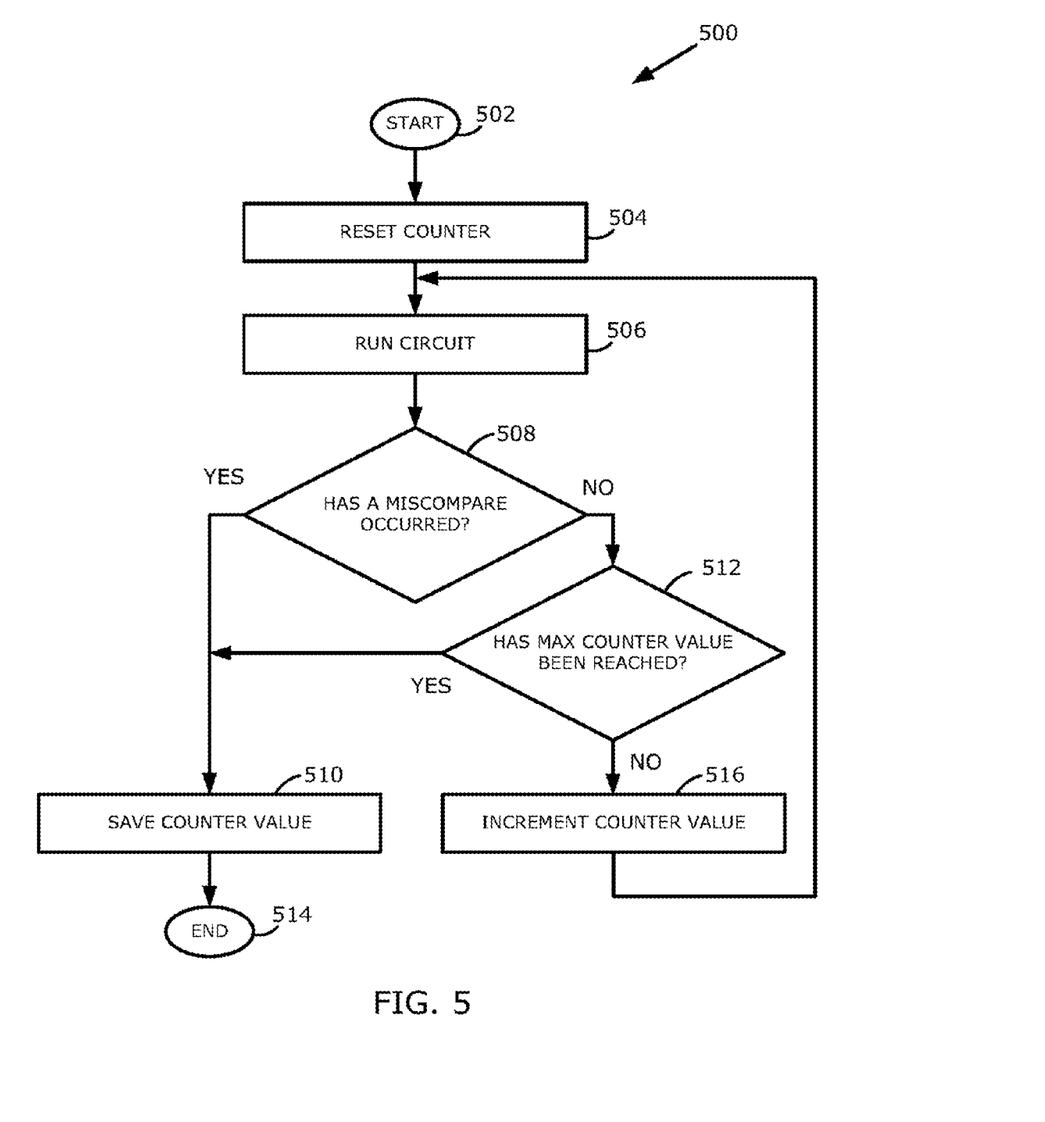
FIG. 5, is a flowchart diagram of a method, in accordance with an embodiment of the present disclosure.

FIG. 5 is a flowchart diagram of a method 500 of operating monitor circuit 102 by adjusting the delay line 112. The delay line can be automatically adjusted by, for example, auto-calibrator 126. The method begins at 502. The circuit 102 can be in idle at this point in time.

At 504, the counter 306 of the delay line 112 is reset. This may be executed in response to an appropriate signal such as a calibration signal being received.

At 506, monitoring circuit 102 is also allowed to run that it can be used to monitor the logic cell. In some embodiments, the monitoring circuit 102 is run for 32 clock cycles at each iteration of 506 before executing 508.

At 508, it is determined whether a miscompare occurred during 506. If a miscompare has occurred then 510 is executed and otherwise 512 is executed.

At 512, the counter value is saved to a set of registers, which can be read by the user. After 512 has been executed, the process ends at 514.

As mentioned above, if no miscompare has occurred at 506, then 512 is executed after 508.

At 512, it is determined whether the counter 306 has reached its maximum value. If the counter 306 has reached its maximum value then 510 is executed. On the other hand, if the counter has not reached its maximum then 516 is executed.

At 516, the value of counter 306 is incremented. After 516 has been executed, 506 is repeated.

Figure 6:
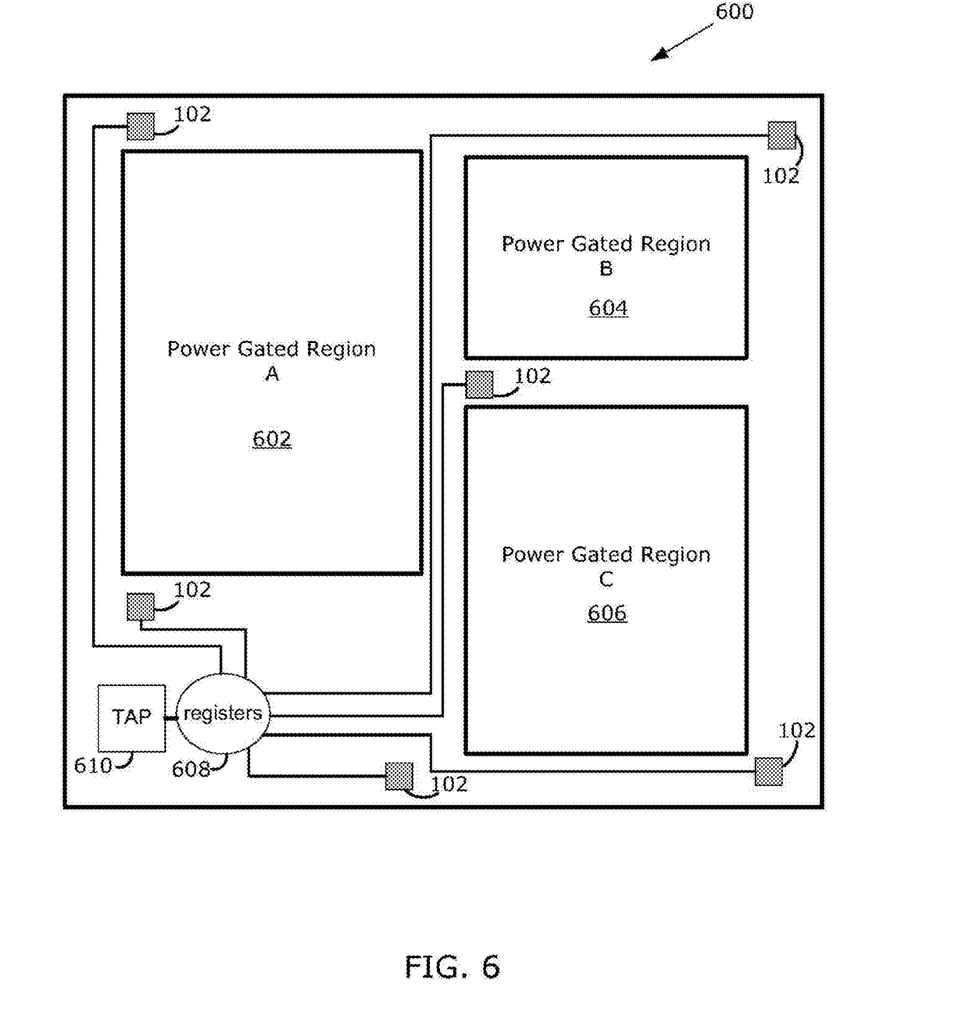
FIG. 6 is a block diagram of a full chip, in accordance with an embodiment of the present disclosure.

FIG. 6 is an example block diagram of a full chip, in accordance with an embodiment of the present disclosure. More specifically, FIG. 6 illustrates a chip 600 top level where the canary systems 100 are scattered across the die and next to each power gated region (e.g. power gated regions 602, 604, and 606).

Figure 7:
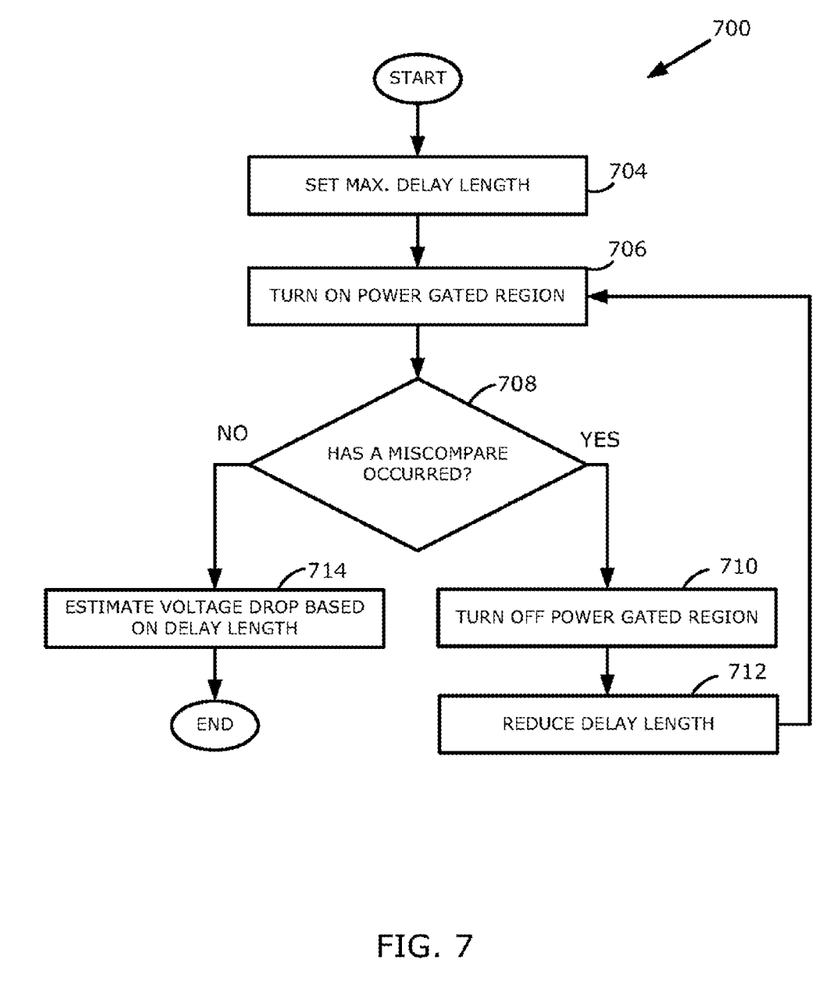
FIG. 7 is a flow chart diagram illustrating a method of estimating a voltage drop, according to various embodiments.

In the embodiment illustrated, all input and output signals are connected to center user defined registers 608, which are read/write-able by other interface logic such as a TAP controller 610 (IEEE 1149.1 standard). Other embodiments can utilize other arrangements. For example, registers could also be assigned to some memory space and be read/writeable from an on-chip microprocessor. FIG. 7 is a flow chart diagram illustrating a method 700 of measuring the dynamic voltage drop in a region of a chip induced by in-rush current.

At 704, the monitoring circuit 102 that is adjacent to the region of interest is first configured with a maximum delay length according to auto calibrator circuit 126. At 706, the power gated region is turned on.

At 708, it is determined whether a miscompare has occurred. If a miscompare has occurred then 710 is executed. If on the other hand a miscompare has not occurred, then 714 is executed.

At 710, the power gated region is turned off.

At 712, the delay length is reduced to increase the margin. In some embodiments, the delay length is adjusted by one unit (e.g. one buffer) at each iteration of 710. In other embodiments, the delay length can be adjusted by other amounts. After 710 has been executed, 708 is repeated.

At 714, the voltage drop is estimated based on the delay length programmed into programmable delay line. The magnitude of voltage drop can be approximated using SPICE simulation of the canary circuit. In various embodiments, a simple rough estimation of voltage drop can be approximated based on delta in delay line between setting in 704 and 710. For example, if delay line delta between 704 and 710 is 10% of 704, voltage drop is approximate 10% of nominal VDD. However, the exact translation of delay line delta to voltage delta is process and voltage dependent. In various embodiments, this measurement can be done as part of device characterization procedure to quantify the robustness of the power gating design. In addition, in various embodiments this procedure is repeatable.

In various embodiments, the auto calibrator circuit 126 can be used to measure the process corner of a device. For example, in some embodiments, to measure the process corner of the device in question, one can refer to the delay count returned by the calibrator. The delay count returned by the calibrator for each type of delay line indicates the process corner of the device. A smaller delay count indicates a slower process. A longer delay count indicates a faster process. SPICE simulation can be used to further correlate the process corner with the manufacturing specification.

In-rush current is a well-known problem in power gated design. The consequence of large in-rush current is a voltage drop that can cause circuit failure. Due to the increasing complexity of deep submicron designs, it is not feasible to simulate such voltage drop in SPICE due to the millions of transistors and RC network involved. In addition, on-die measurement is difficult or even infeasible due to the narrow pulsewidth (high frequency energy content, i.e., fast transients) of the voltage spikes and the inductance on the package and the probe. The voltage drop can also be very local, requiring multiple probe points. Some embodiments described herein provide the means to indirectly measure the dynamic voltage drop at minimal cost (die area and power).

Various embodiments and high level description of canary circuit PVT monitor have been described in this document. Various modifications will be apparent to those of skill in the art based on the present disclosure. The cell types of canary circuits, number of buffers in delay lines, and counter widths are intended to be illustrative of the invention and not intended to be limiting.

In the preceding description, for purposes of explanation, numerous details are set forth in order to provide a thorough understanding of the embodiments. However, it will be apparent to one skilled in the art that these specific details are not required. For example, throughout this disclosure, specific numbers of clock cycles, counter sizes, and other values have been provided as examples only and one of skill in the art will understand that other embodiments can use other appropriate values. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A monitoring system for monitoring the operation of an integrated circuit, the monitoring system comprising:
   a reference circuit comprising a first register and a first inverter coupled in a first feedback loop to provide a reference signal delay path having a first setup margin, and an output for outputting a reference signal;
   a monitoring circuit, the monitoring circuit comprising:
      a second register;
      a second inverter;
      a programmable delay line;
      wherein the second register, the programmable delay line, and the second inverter are coupled in a feedback loop to provide a controllably selectable delay path having a controllably selectable second setup margin; and
      an output for outputting a delayed signal; and
   a comparison circuit, for comparing the output reference signal to the output delayed signal and determining whether a time setup error has occurred based on the comparison.

2. The monitoring system of claim 1, wherein the programmable delay line comprises a plurality of buffers and multiplexers coupled to each other such that a number of buffers in the delay line is controllably selectable.

3. The monitoring system of claim 1, further comprising an auto calibrator circuit coupled to the programmable delay line for calibrating the programmable delay line.

4. The monitoring system of claim 3, wherein the monitoring system is configured to:
   set a delay length of the programmable delay line;
   compare the delay signal to the reference signal;
   if a value of the delay signal does not match a value of the reference signal, then:
      incrementally increase the delay length; and
      for each value of the delay length, compare the delay signal to the reference signal;
   record the delay length when either value of the delay signal does not match a value of the reference signal or a maximum value of the delay length is reached.

5. The monitoring system of claim 3, wherein the monitoring system is configured to:
   set a delay length of the delay line;
   compare the delay signal to the reference signal;
   if a value of the delay signal does not match a value of the reference signal, then:
      incrementally decrease the delay length; and
      for each value of the delay length, compare the delay signal to the reference signal;
   record the delay length when either value of the delay signal does not match a value of the reference signal or a minimum value of the delay length is reached.

6. A method of monitoring the operation of an integrated circuit, the method comprising:
   providing a reference circuit on the integrated circuit, the reference circuit comprising a first register and a first inverter coupled in a first feedback loop to provide a reference signal delay path having a first setup margin, and an output for outputting a reference signal;
   providing a monitoring circuit on the integrated circuit, the monitoring circuit comprising:
      a second register;
      a second inverter;
      a programmable delay line;
      wherein the second register, the programmable delay line, and the second inverter are coupled in a feedback loop to provide a controllably selectable delay path having a controllably selectable second setup margin; and
      an output for outputting a delayed signal;
   setting a delay length of the programmable delay line;
   providing power to the integrated circuit; and
   comparing the output reference signal and the output delay signal to determine whether a time setup error has occurred.

7. The method of claim 6, wherein providing power to the integrated circuit comprises powering up a power gated region of the integrated circuit.

8. The method of claim 6, further comprising determining that an error has occurred if a value of the delay signal does not match a value of the reference signal.

9. The method of claim 8, further comprising:
   if an error has not occurred, incrementally adjusting the delay length of the programmable delay line; and
   periodically comparing the reference signal and delay signal.

10. The method of claim 9, further comprising:
    if an error has occurred, estimating a voltage drop experienced by a power gated region based on the delay length of the programmable delay line.

11. The method of claim 9, wherein the initial value of the delay line length is a maximum delay line length of the programmable delay line and the delay length is incrementally reduced.

12. The method of claim 9, wherein the initial value of the delay line length is a minimum delay line length of the programmable delay line and the delay length is incrementally increased.

* * * * *